United States Patent
Honda et al.

(10) Patent No.: US 9,170,160 B2
(45) Date of Patent: Oct. 27, 2015

(54) IMAGING DEVICE

(71) Applicant: KABUSHIKI KAISHA TOSHIBA, Tokyo (JP)

(72) Inventors: Hiroto Honda, Yokohama (JP); Kazuhiro Suzuki, Tokyo (JP); Hideyuki Funaki, Tokyo (JP); Masaki Atsuta, Yokosuka (JP); Keita Sasaki, Yokohama (JP); Koichi Ishii, Kawasaki (JP); Honam Kwon, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/693,661

(22) Filed: Apr. 22, 2015

(65) Prior Publication Data

US 2015/0241282 A1 Aug. 27, 2015

Related U.S. Application Data

(63) Continuation of application No. 13/728,009, filed on Dec. 27, 2012, now abandoned.

(30) Foreign Application Priority Data

Mar. 23, 2012 (JP) .................. 2012-068158

(51) Int. Cl.
*G01J 5/20* (2006.01)
*G01J 5/12* (2006.01)
(Continued)

(52) U.S. Cl.
CPC .. *G01J 5/12* (2013.01); *G01J 5/023* (2013.01); *G01J 5/22* (2013.01); *H04N 5/33* (2013.01); *G01J 2005/0077* (2013.01)

(58) Field of Classification Search
CPC ........ G01J 5/20; G01J 5/10; H01L 27/14649; H04N 5/33
USPC ...................................... 250/338.4
See application file for complete search history.

(56) References Cited

U.S. PATENT DOCUMENTS 6,717,228 B2   4/2004   Ando et al.
7,535,003 B2   5/2009   Honda et al.
(Continued)

FOREIGN PATENT DOCUMENTS

EP   2 105 963 A2   9/2009
JP   11-064111 A   3/1999
(Continued)

OTHER PUBLICATIONS

Extended European Search Report issued May 24, 2013, in European Patent Application No. 12199635.9.
(Continued)

*Primary Examiner* — David Porta
*Assistant Examiner* — Abra Fein
(74) *Attorney, Agent, or Firm* — Oblon, McClelland, Maier & Neustadt, L.L.P.

(57) ABSTRACT

An imaging device according to an embodiment includes: a semiconductor substrate; a reference pixel with a first concave portion disposed in a first portion of a surface of the semiconductor substrate; and one or more infrared detection pixels each configured to detect light with a second concave portion disposed in a second portion of the surface of the semiconductor substrate, the reference pixel being directly connected to the semiconductor substrate at a position where the first concave portion is not present, and including a first thermoelectric conversion unit configured to convert heat to an electric signal, the first thermoelectric conversion unit being disposed in the first concave portion and including a first thermoelectric conversion element, each infrared detection pixel including a second thermoelectric conversion unit being disposed in the second concave portion and including a second thermoelectric conversion element.

9 Claims, 4 Drawing Sheets

(51) Int. Cl.
  *H04N 5/33* (2006.01)
  *G01J 5/22* (2006.01)
  *G01J 5/02* (2006.01)
  *G01J 5/00* (2006.01)

(56) References Cited

U.S. PATENT DOCUMENTS

| | | |
|---|---|---|
| 7,943,905 B2 | 5/2011 | Honda et al. |
| 8,338,902 B2 | 12/2012 | Kwon et al. |
| 2002/0040967 A1 | 4/2002 | Oda |
| 2009/0266987 A1 | 10/2009 | Honda et al. |
| 2009/0322922 A1 | 12/2009 | Saito et al. |
| 2010/0230594 A1 | 9/2010 | Honda et al. |
| 2012/0228506 A1 | 9/2012 | Honda et al. |

FOREIGN PATENT DOCUMENTS

| | | |
|---|---|---|
| JP | 2001-304973 A | 10/2001 |
| JP | 2008-022315 A | 1/2008 |
| JP | 2008-241465 A | 10/2008 |
| JP | 2010-32410 | 2/2010 |
| JP | 2012-047484 A | 3/2012 |

OTHER PUBLICATIONS

Office Action issued Jul. 18, 2014 in Japanese Patent Application No. 2012-068158 (with English language translation).

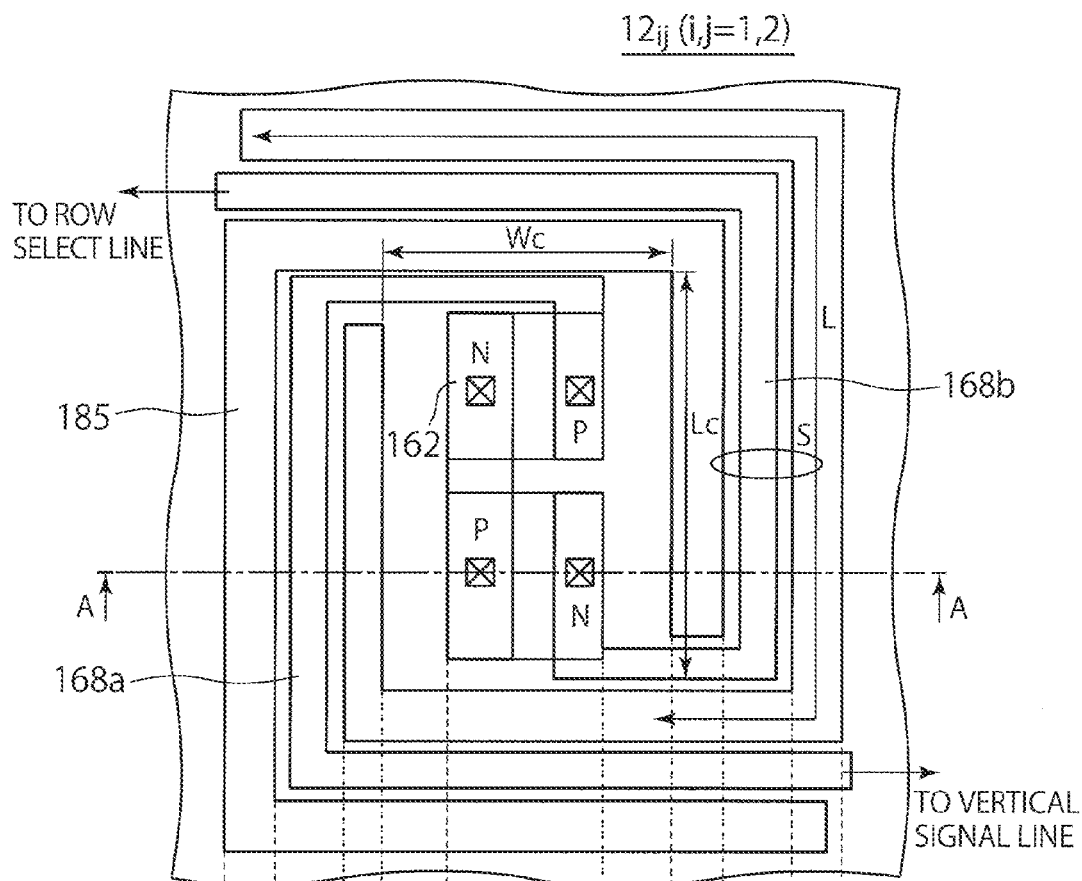
FIG. 2A
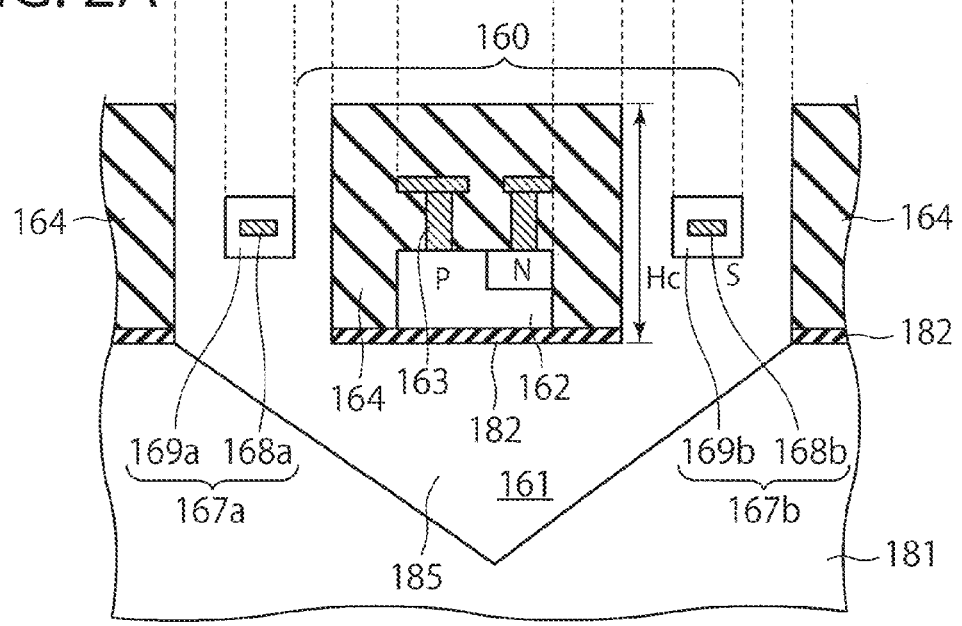
FIG. 2B  A-A CROSS-SECTION

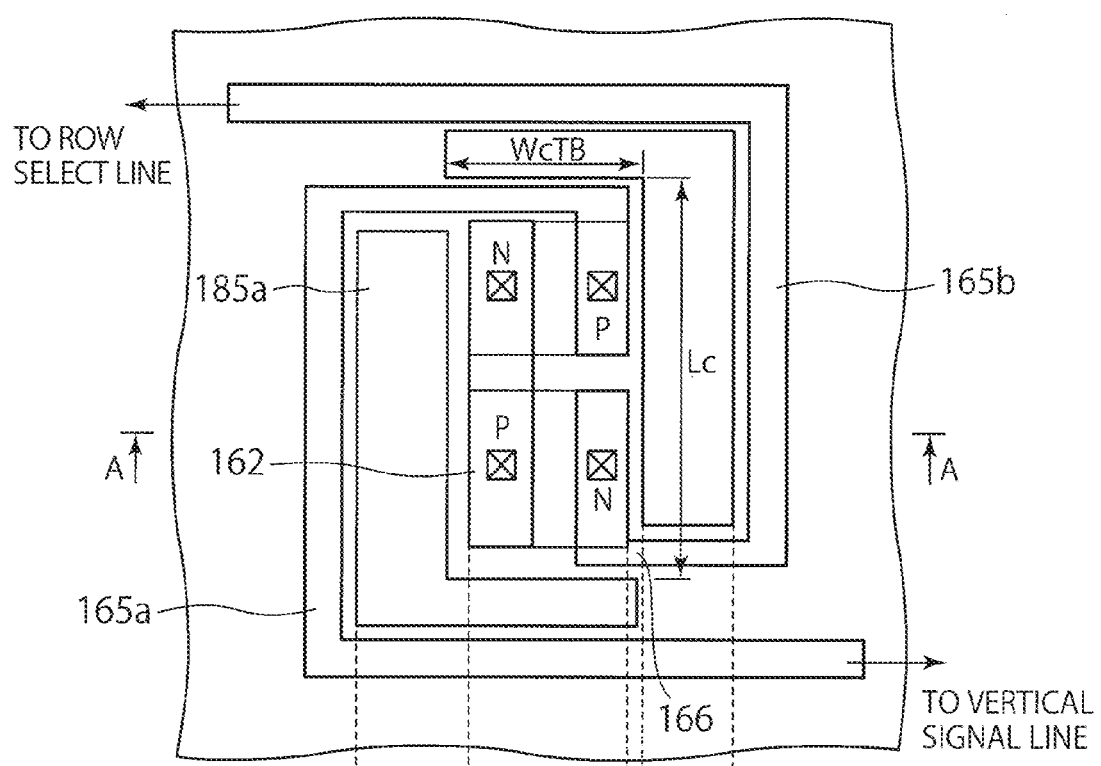
FIG. 3A
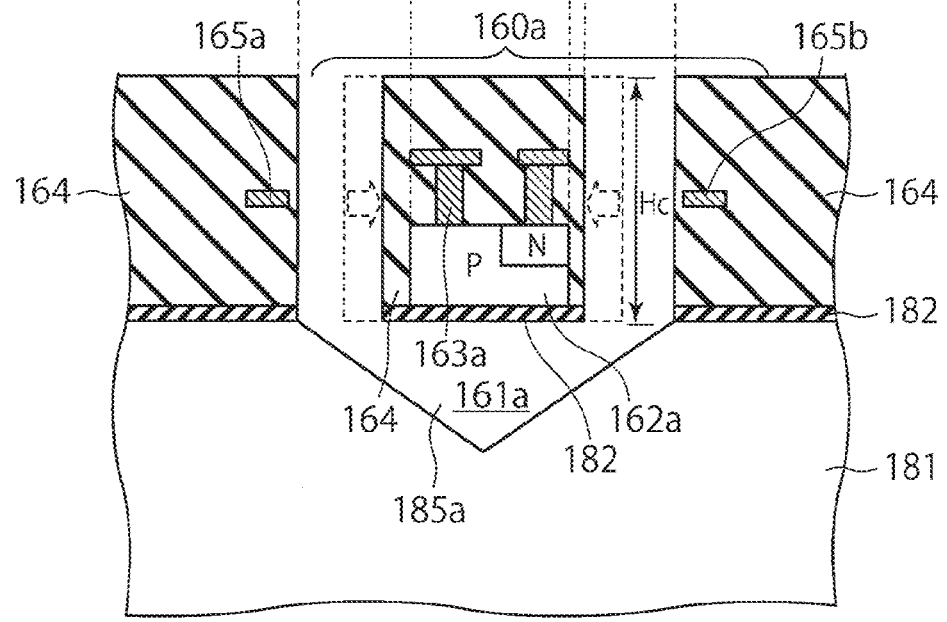
FIG. 3B   A-A CROSS-SECTION

US 9,170,160 B2

IMAGING DEVICE

CROSS-REFERENCE TO RELATED APPLICATION

This application is a continuation application of U.S. application Ser. No. 13/728,009 filed Dec. 27, 2012, which is based upon and claims the benefit of priority from prior Japanese Patent Application No. 2012-68158 filed on Mar. 23, 2012, the entire contents of which are incorporated herein by reference.

FIELD

An embodiment described herein relates generally to an imaging device.

BACKGROUND

Infrared rays are radiated from a heat source even in the dark, and characteristically have higher permeability than visible light in smoke or fog. Accordingly, infrared imaging can be performed during day and night. Also, temperature information about an object can be obtained through infrared imaging. In view of this, infrared imaging can be applied to a wide variety of fields such as the defense field and the fields of security cameras and fire detecting cameras.

In recent years, "uncooled infrared imaging devices" that do not require cooling mechanisms have been actively developed. An uncooled or thermal infrared imaging device converts an incident infrared ray of approximately 10 μm in wavelength into heat with an absorption mechanism, and further converts the temperature change at the heat sensitive unit caused by the small amount of heat into an electrical signal with a thermoelectric conversion means. The uncooled infrared imaging device reads the electrical signal, to obtain infrared image information.

For example, there have been infrared sensors each using a silicon pn junction that converts a temperature change into a voltage change by applying a constant forward current. Characteristically, such infrared sensors can be mass-produced through a silicon LSI manufacturing process using a SOI (Silicon On Insulator) substrate as a semiconductor substrate. Also, the rectification properties of the silicon pn junctions serving as the thermoelectric conversion means are utilized to realize the row select function, and accordingly, the pixels can be designed to have very simple structures.

One of the indicators of the performance of an infrared sensor is NETD (Noise Equivalent Temperature Difference), which indicates the temperature resolution of the infrared sensor. It is critical to reduce the NETD, or reduce the infrared sensor temperature difference equivalent to noise. To do so, it is necessary to increase signal sensitivity and reduce noise.

Thermoelectric conversion elements are sensitive to temperature components other than temperature rises caused by incident infrared rays, or to the temperature of the semiconductor substrate and the self-heating temperature at the time of flowing of current. To correct those "offset temperatures", reference pixels are provided.

Like an infrared detection pixel, a conventional reference pixel reflects the influence of the temperature of the semiconductor substrate, but has a different self-heating temperature from that of an infrared detection pixel. The difference in self-heating temperature is much larger than a signal generated from an incident infrared ray, and therefore, it is necessary to correct the difference.

BRIEF DESCRIPTION OF THE DRAWINGS

FIGS. 2A and 2B are a plan view and a cross-sectional view of an infrared detection pixel according to the embodiment, respectively;

FIGS. 3A and 3B are a plan view and a cross-sectional view of a reference pixel according to the embodiment, respectively.

DETAILED DESCRIPTION

An imaging device according to an embodiment includes: a semiconductor substrate; a reference pixel with a first concave portion disposed in a first portion of a surface of the semiconductor substrate; and one or more infrared detection pixels each configured to detect light with a second concave portion disposed in a second portion of the surface of the semiconductor substrate, the reference pixel being directly connected to the semiconductor substrate at a position where the first concave portion is not present, and including a first thermoelectric conversion unit configured to convert heat to an electric signal, the first thermoelectric conversion unit being disposed in the first concave portion and including a first thermoelectric conversion element, each infrared detection pixel including a second thermoelectric conversion unit being disposed in the second concave portion and including a second thermoelectric conversion element.

The following is a description of an embodiment, with reference to the accompanying drawings.

Figure 1:
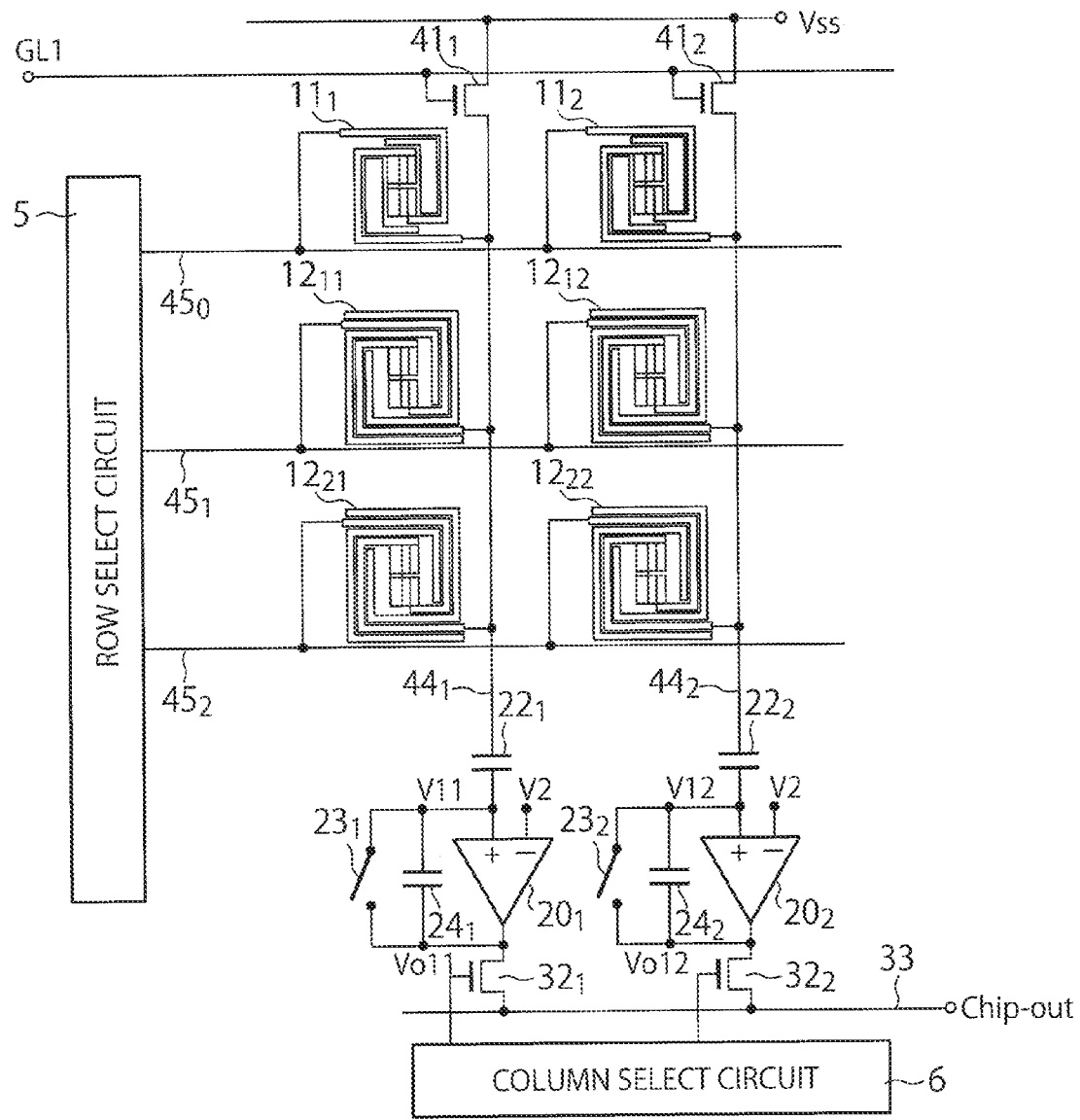
FIG. 1 is a circuit diagram of an uncooled infrared imaging device according to an embodiment.

FIG. 1 shows an uncooled infrared imaging device (hereinafter also referred to as the infrared sensor) according to an embodiment. The infrared sensor of this embodiment includes an imaging region formed on a semiconductor substrate. In this imaging region, there are two reference pixels $11_1$ and $11_2$ that are arranged in one row and two columns, and infrared detection pixels $12_{ij}$ (i, j=1, 2) arranged in two rows and two columns, for example. Although an imaging region normally accommodates more pixels than the above, the imaging region in this embodiment accommodates pixels, or reference pixels and infrared detection pixels, which are arranged in three rows and two columns, for descriptive purposes. Each of the pixels includes a pn junction (diodes) serving as a thermoelectric conversion element, which will be described later in detail.

The first terminal (the anode-side terminal of the pn junction) of each of the reference pixels $11_1$ and $11_2$ is connected to a row select line $45_0$. The second terminals (the cathode-side terminals of the pn junctions) of the reference pixels $11_1$ and $11_2$ are connected to vertical signal lines (hereinafter also referred to simply as the signal lines) $44_1$ and $44_2$, respectively. The respective first terminals (the anode-side terminals of the pn junctions) of the infrared detection pixels $12_{11}$ and $12_{12}$ of the first row are connected to a row select line $45_1$. The second terminals (the cathode-side terminals of the pn junctions) of the infrared detection pixels $12_{11}$ and $12_{12}$ are connected to the vertical signal lines $44_1$ and $44_2$, respectively. The respective first terminals (the anode-side terminals of the pn junctions) of the infrared detection pixels $12_{21}$ and $12_{22}$ of the second row are connected to a row select line $45_2$. The second terminals (the cathode-side terminals of the pn junctions) of the infrared detection pixels $12_{21}$ and $12_{22}$ are connected to the vertical signal lines $44_1$ and $44_2$, respectively.

Each of the row select lines $45_0$, $45_1$, and $45_2$ is connected to a row select circuit 5. The rows are sequentially selected one by one by the row select circuit 5, and a bias voltage Vd is applied to each selected row. One terminal of each signal line $44_i$ (i=1, 2) is connected to a power source Vss via a load transistor $41_i$, and the other terminal is connected to the positive-side input terminal of a differential amplifier $20_i$ via a coupling capacitor $22_i$. The load transistors $41_1$ and $41_2$ operate in a saturation region, and supply a constant current to the pixels of a selected row in accordance with a gate voltage GL1 applied to the gates thereof. That is, the load transistors 41 function as constant current sources. The source voltage of each of the load transistors $41_1$ and $41_2$ is represented by Vd0.

A voltage V2 is applied to the negative-side input terminal of each differential amplifier $20_i$ (i=1, 2), and the output terminal of each differential amplifier $20_i$ is connected to a read line 33 via a read transistor $32_i$. Upon receipt of a select signal from a column select circuit 6, each read transistor $32_i$ (i=1, 2) is switched on.

A feedback switch $23_i$ and a feedback capacitor $24_i$ are connected in parallel between the positive-side input terminal and the output terminal of each differential amplifier $20_i$ (i=1, 2). A coupling capacitor $22_i$ (i=1, 2), a differential amplifier $20_i$, a feedback switch $23_i$, and a feedback capacitor $24_i$ constitute a differential clamp circuit. As will be described later, this differential clamp circuit holds signals that are output from the reference pixel connected to the corresponding signal line, and amplifies a differential signal when an infrared detection pixel connected to the corresponding signal line is selected.

When the row select circuit 5 applies the bias voltage Vd to a selected row, a series voltage Vd−Vd0 is applied to the pn junctions of the reference pixels or the infrared detection pixels connected to the selected row. For example, if the row select line $45_0$ is selected, the series voltage Vd−Vd0 is applied to the pn junctions of the reference pixels $11_1$ and $11_2$. If the row select line $45_1$ is selected, the series voltage Vd−Vd0 is applied to the pn junctions of the infrared detection pixels $12_{11}$ and $12_{12}$. If the row select line $45_2$ is selected, the series voltage Vd−Vd0 is applied to the pn junctions of the infrared detection pixels $12_{21}$ and $12_{22}$. All the pn junctions of the pixels of the unselected rows are inversely-biased. Therefore, the unselected row select lines are separated from the signal lines $44_1$ and $44_2$. That is, it can be said that the pn junctions each have a pixel select function.

The potential of each of the vertical signal lines $44_1$ and $44_2$ when any infrared ray is not received is defined as Vs1. Upon receipt of an infrared ray, the pixel temperature of each infrared detection pixel $12_{ij}$ (i, j=1, 2) becomes higher. Accordingly, the potential of each of the vertical signal lines $44_1$ and $44_2$ becomes higher than Vs1. For example, when the object temperature varies by 1 K (Kelvin), the temperature of an infrared detection pixel $12_{ij}$ (i,j=1, 2) varies by approximately 5 mK. With the thermoelectric conversion efficiency being 10 mV/K, the potential of each of the vertical signal lines $44_1$ and $44_2$ increases by approximately 50 μV, which is much smaller than the increase of the bias voltage Vd.

Upon receipt of an infrared ray, the potential of each of the vertical signal line $44_1$ and $44_2$ becomes Vd−(Vf0−Vsig−Vsh). Here, Vf0 represents the forward voltage of a pn junction when no infrared ray is received, and Vsig represents the voltage signal based on the temperature rise in the later described thermoelectric converting unit of an infrared detection pixel. Vsh represents the change in voltage due to the Joule heat generated when a current is applied to the pn junction. The self-heating amount is expressed by the following equation (1):

$$T_{cell}(t) = \frac{I_f V_f}{G_{th}} \left\{ 1 - \exp\left(-\frac{t}{C_{th}/G_{th}}\right) \right\} \quad (1)$$

Here, $I_f$ represents the amount of current determined by the operating points of the load transistors $41_1$ and $41_2$, $V_f$ represents the forward voltage of the pn junction, t represents the time elapsed from the start of flowing the current, and $C_{th}$ and $G_{th}$ represent the heat capacity and the heat conductance of the infrared detection pixel $12_{ij}$ (i, j=1, 2), respectively. Those items will be described later. In a case where t is sufficiently smaller than the value expressed by $C_{th}/G_{th}$, the equation (1) is approximated by the following equation (2), and the temperature increases in proportion to time.

$$T_{cell}(t \to 0) = \frac{I_f V_f}{C_{th}} t \quad (2)$$

FIG. 2A is a plan view of an infrared detection pixel $12_{ij}$ (i, j=1, 2). FIG. 2B is a cross-sectional view of the infrared detection pixel $12_{ij}$ (i, j=1, 2), taken along the section line A-A of FIG. 2A. The infrared detection pixel $12_{ij}$ (i, j=1, 2) includes a cell 160 formed on a SOI substrate. The SOI substrate includes a supporting substrate 181, a buried insulating layer (a BOX layer) 182, and a SOI (Silicon-On-Insulator) layer formed with silicon single crystals. The SOI substrate has a concave portion 185 formed in a surface portion thereof. The concave portion 185 is formed by removing part of the supporting substrate 181.

The cell 160 includes a thermoelectric converting unit 161, and supporting structure units 167a and 167b that support the thermoelectric converting unit 161 above the concave portion 185. The thermoelectric converting unit 161 includes diodes (two diodes in FIG. 2A) 162 connected in series, an interconnect 163 connecting those diodes 162, and an infrared absorption film 164 formed to cover the diodes 162 and the interconnect 163.

The supporting structure unit 167a includes: a connective interconnect 168a that has one end connected to the corresponding vertical signal line and has the other end connected to one end of the series circuit formed with the series-connected diodes 162; and an insulating film 169a coating the connective interconnect 168a. The other supporting structure unit 167b includes: a connective interconnect 168b that has one end connected to the corresponding row select line and has the other end connected to the other end of the series circuit formed with the series-connected diodes 162; and an insulating film 169b coating the connective interconnect 168b.

The infrared absorption film 164 generates heat upon receipt of an incident infrared ray. The diodes 162 convert the heat generated by the infrared absorption film 164 into an electrical signal. The supporting structure units 167a and 167b have elongate shapes so as to surround the thermoelectric converting unit 161. With this arrangement, the thermoelectric converting unit 161 is supported on the SOI substrate, while being substantially heat-insulated from the SOI substrate.

Having such a structure, each infrared detection pixel $12_{ij}$ (i, j=1, 2) stores the heat generated from an incident infrared ray, and can output the voltage based on the heat to the signal line $44_1$ or $44_2$. The bias voltage Vd from the row select line $45_1$ or $45_2$ is transferred to the thermoelectric converting unit 161 via the interconnect 168b. The signal that has passed the thermoelectric converting unit 161 is transferred to the vertical signal line $44_1$ or $44_2$ via the interconnect 168a.

FIG. 3A is a plan view of a reference pixel $11_i$ (i=1, 2). FIG. 3B is a cross-sectional view of the reference pixel $11_i$ (i=1, 2), taken along the section line A-A of FIG. 3A. The reference pixel $11_i$ (i=1, 2) includes a cell 160a formed on a SOI substrate. The SOI substrate includes a supporting substrate 181, a buried insulating layer (a BOX layer) 182, and a SOI (Silicon-On-Insulator) layer formed with silicon single crystals. The SOI substrate has a concave portion 185a formed in a surface portion thereof. The concave portion 185a is formed by removing part of the supporting substrate 181.

The cell 160a includes a thermoelectric converting unit 161a formed on the buried insulating layer 182. The thermoelectric converting unit 161a includes diodes (two diodes in FIG. 3A) 162a connected in series, an interconnect 163a connecting those diodes 162a, and an infrared absorption film 164a formed to cover the diodes 162a and the interconnect 163a. One end of the series circuit formed with the series-connected diodes 162a is connected to a vertical signal line via an interconnect 165a, and the other end of the series circuit is connected to a row select line via an interconnect 165b. The interconnects 165a and 165b are formed in regions where the concave portion 185a is not formed. The concave portion 185a is formed below the thermoelectric converting unit 161a. However, the thermoelectric converting unit 161a is connected to the portion of the buried insulating layer 182 formed outside the region where the concave portion 185a is formed and to the portion of the insulating film 164 formed on the portion of the buried insulating layer 182, via the buried insulating layer 182. Accordingly, unlike the thermoelectric converting unit 161 of each infrared detection pixel, the thermoelectric converting unit 161a does not need to be supported above the concave portion 185a by elongate supporting structure units. That is, unlike the thermoelectric converting unit 161 of each infrared detection pixel, the thermoelectric converting unit 161a is not heat-insulated by elongate supporting structure units. Therefore, the heat generated from an infrared ray is smaller by several digits than that generated by an infrared detection pixel, and can be ignored. That is, in each reference pixel, the heat conductance $G_{th}$, which is an indicator of heat insulating properties, is much higher than that of each infrared detection pixel, and heat easily escapes from each reference pixel.

The unit of the heat conductance $G_{th}$ is W/K, indicating how many watts of energy is transferred in a case where a heat conductor exists between two heat baths between which the temperature difference is 1 K. The heat conductance $G_{th}$ is expressed as $G_{th}=\kappa S/L$ (W/K), where $\kappa$ (W/(K·m)) represents the heat conductivity, S (m$^2$) represents the cross-sectional area, and L (m) represents the length of the material responsible for heat conduction, or of the connective interconnects 168a and 168b and the insulating films 169a and 169b constituting the supporting structure units 167a and 167b. That is, a structure with a larger cross-sectional area and a shorter length has higher heat conductance.

Meanwhile, the heat capacity $C_{th}$ is the indicator of how many joules of energy is required to increase the temperature of an object by 1K, and the unit thereof is J/K. The heat capacity $C_{th}$ is expressed as $C_{th}=c \cdot d \cdot V$, where c (J/kg) represents the specific heat of the material, V (m$^3$) represents the volume of the material, and d (kg/m$^3$) represents the density of the material.

The heat conductance $G_{th\_IMG}$ and the heat capacity $C_{th\_IMG}$ of each infrared detection pixel $12_{ij}$ (i, j=1, 2) are expressed as:

$$G_{th\_IMG}=\kappa_2 \cdot S/L$$

$$C_{th\_IMG}=c_2 \cdot d_2 \cdot Lc \cdot Wc \cdot Hc \quad (3)$$

Here, S represents the cross-sectional area of the supporting structure units 167a and 167b, L represents the length of the supporting structure units 167a and 167b, Lc and Wc represent the length and the width of the thermoelectric converting unit 161, respectively, and Hc represents the height of the thermoelectric converting unit 161 inclusive of the thickness of the buried insulating film 182. Meanwhile, $\kappa_2$, $c_2$, and $d_2$ represent the heat conductivity, the specific heat, and the density of each of the supporting structure units 167a and 167b, respectively.

The heat conductance $G_{th\_TB}$ and the heat capacity $C_{th\_TB}$ of each reference pixel $11_i$ (i=1, 2) are expressed as:

$$G_{th\_TB}=\kappa_1 \cdot S_{TB}/L_{TB}$$

$$C_{th\_TB}=c_1 \cdot d_1 \cdot Lc \cdot Wc_{TB} \quad (4)$$

Here, $S_{TB}$ and $L_{TB}$ represent the cross-sectional area and the length of the connecting portion 166 between the thermoelectric converting unit 161a and the interconnects 165a and 165b, respectively, Lc and $Wc_{TB}$ represent the length and the width of the thermoelectric converting unit 161a, respectively, and Hc represents the height of the thermoelectric converting unit 161a inclusive of the thickness of the buried insulating film 182. Meanwhile, $\kappa_1$, $c_1$, and $d_1$ represent the heat conductivity, the specific heat, and the density of the connecting portion 166 between the thermoelectric converting unit 161a and the interconnects 165a and 165b, respectively.

In each reference pixel $11_i$ (i=1, 2), the plane pattern of the concave portion 185a is designed so that the width $Wc_{TB}$ of the thermoelectric converting unit 161a is smaller than the width Wc of the thermoelectric converting unit 161 of each infrared detection pixel $12_{ij}$ (i, j=1, 2).

Therefore, the heat conductance of each reference pixel is lower than the heat conductance of each infrared detection pixel, and the heat capacity of each reference pixel is smaller than the heat capacity of each infrared detection pixel. That is, the following inequalities are satisfied:

$$G_{th\_TB} < G_{th\_IMG}$$

$$C_{th\_TB} < C_{th\_IMG}$$

Figure 4A:
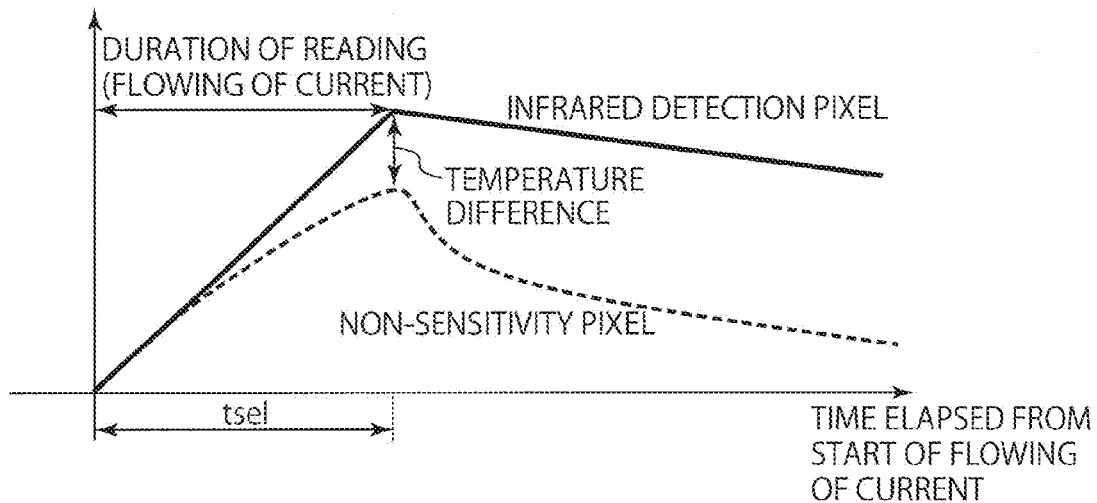
FIGS. 4A and 4B are graphs showing the self-heating amounts in an infrared detection pixel and a reference pixel, respectively.
Figure 4B:
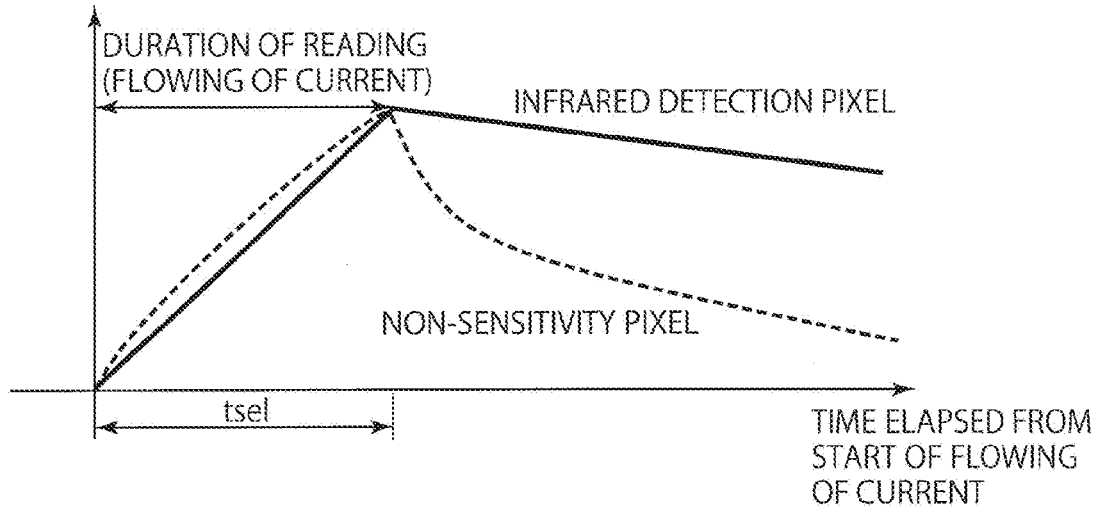

FIGS. 4A and 4B show graphs of the self-heating amounts in each infrared detection pixel $12_{ij}$ (i, j=1, 2) and each reference pixel $11_i$ (i=1, 2). FIG. 4A illustrates the self-heating in a case where the heat capacity $C_{th\_TB}$ of each reference pixel $11_i$ (i=1, 2) is equal to the heat capacity $C_{th\_IMG}$ of each infrared detection pixel $12_{ij}$ (i, j=1, 2), or where the areas of the cells 160 and 160a are the same. Once flowing of current is started, the temperature of each pixel increases according to the equation (1). As for each infrared detection pixel $12_{ij}$ (i, j=1, 2), the heat conductance $G_{th\_IMG}$ is very low, and the ratio $C_{th\_IMG}/G_{th\_IMG}$ is high. Accordingly, the thermal time constant is high, and the temperature increases according to the equation (2) at the time of short-time flowing of current. As for each reference pixel $11_i$ (i=1, 2), the heat conductance $G_{th\_TB}$ is higher than the heat conductance of each infrared detection pixel. Therefore, as indicated by the equation (1), the temperature increase rate becomes lower with time. In this case, the self-heating temperature rises of both pixels differ from each other when the flowing of current ends. This difference is on the order of approximately 100 mK in a case where a current of 1 μA is applied, and is larger than a signal with respect to an object temperature change by about two digits.

However, in a case where the heat capacity $C_{th\_TB}$ of each reference pixel $11_i$ (i=1, 2) is made smaller than the heat capacity $C_{th\_IMG}$ of each infrared detection pixel $12_{ij}$ (i, j=1, 2), or where the area of the cell 160a is made smaller than the area of the cell 160 as in this embodiment, the self-heating temperatures can be made the same when the flowing of current ends, as shown in FIG. 4B. At this point, the design parameters of each pixel should satisfy the following equation:

$$\frac{I_f V_f}{G_{th\_IMG}}\left\{1-\exp\left(-\frac{tsel}{C_{th\_IMG}/G_{th\_IMG}}\right)\right\} =$$
$$\frac{I_f V_f}{G_{th\_TB}}\left\{1-\exp\left(-\frac{tsel}{C_{th\_TB}/G_{th\_TB}}\right)\right\}$$

Since each infrared detection pixel $12_{ij}$ (i, j=1, 2) and each reference pixel $11_i$ (i=1, 2) are operated under the same current and voltage conditions, $I_f$ and $V_f$ are equal. Therefore, the following equation should be satisfied:

$$\frac{1}{G_{th\_IMG}}\left\{1-\exp\left(-\frac{tsel}{C_{th\_IMG}/G_{th\_IMG}}\right)\right\} = \tag{5}$$
$$\frac{1}{G_{th\_TB}}\left\{1-\exp\left(-\frac{tsel}{C_{th\_TB}/G_{th\_TB}}\right)\right\}$$

Here, $G_{th\_IMG}$ and $G_{th\_TB}$ represent the heat conductance of each infrared detection pixel and the heat conductance of each reference pixel, respectively, $C_{th\_IMG}$ and $C_{th\_TB}$ represent the heat capacity of the cell of each infrared detection pixel and the heat capacity of the cell of each reference pixel, respectively, tsel represents the duration of flowing of current to each pixel, and the equations (3) and (4) are satisfied. Since the heat capacities $C_{th\_IMG}$ and $C_{th\_TB}$ are proportional to the volumes of the respective cells, a desired heat capacitance $C_{th}$ ratio can be achieved by adjusting the area ratio, as long as the thicknesses are uniform. Even in a case where the structure is designed to satisfy the equation (5), there might be deviations from the equation (5) due to low precision in the manufacturing process or the like. In that case, the same effects as above can be achieved, as long as one of the left-hand value and the right-hand value of the equation (5) is 0.9 to 1.1 times larger than the other one of those values.

Next, an infrared signal read method is described.

In this embodiment, one reference pixel is connected to one signal line of a column of infrared detection pixels, and the reference pixels exist in a different row from those of the infrared detection pixels, as shown in FIG. 1. Since the bias voltage is applied to the row of the reference pixels at a different time from the time when the bias voltage is applied to the rows of the infrared detection pixels, signals cannot be compared at once. Therefore, differential clamp circuits that hold signals output from the reference pixels and amplify only differential signals when an infrared detection pixel is selected are used. Each of those differential clamp circuits includes a coupling capacitor $22_i$ (i=1, 2), a differential amplifier $20_i$ (i=1, 2), a feedback switch $23_i$ (i=1, 2), and a feedback capacitor $24_i$ (i=1, 2).

First, during a first period, the bias voltage Vd is applied to the row select line $45_0$ to which the reference pixels $11_1$ and $11_2$ are connected. As a result of this, the potential of each of the vertical signal lines $44_1$ and $44_2$ becomes Vd−Vf0. This voltage value is 1.0 V, for example.

If the feedback switches $23_1$ and $23_2$ are switched on (short-circuited) at this point, a voltage follower connection is formed, and the input voltages V11, V12 and the output voltages Vo11, Vo12 of the differential amplifiers $20_1$ and $20_2$ become equal to a DC voltage V2. Here, the DC voltage V2 is a constant voltage applied to the differential amplifiers of all the columns, and may be 1.5 V, for example. At this point, the voltage of each of the coupling capacitors $22_1$ and $22_2$ on the side of the vertical signal lines $44_1$ and $44_2$ is 1.0 V, and the voltage of each of the coupling capacitors $22_1$ and $22_2$ on the side of the differential amplifiers $20_1$ and $20_2$ is 1.5 V.

When the feedback switches $23_1$ and $23_2$ are switched off (opened), the above described potential relationship is maintained, but the input voltages V11, V12 and the output voltages Vo11, Vo12 of the differential amplifiers $20_1$ and $20_2$ are cut off from each other. A current is flowed to the reference pixels $11_1$ and $11_2$ in the period from the switching on of the feedback switches $23_1$ and $23_2$ until the switching off of the feedback switches $23_1$ and $23_2$. Here, it is essential that the duration of flowing of current becomes equal to the time tsel in the equation (5).

During a second period, the bias voltage Vd is applied to the row select line $45_1$ to which the infrared detection pixels $12_{11}$ and $12_{12}$ are connected. As a result of this, the potential of each of the vertical signal lines $44_1$ and $44_2$ becomes Vd−(Vf0−Vsig). This voltage value is 1.001 V, for example. The difference between the potentials at both ends of each of the coupling capacitors $22_1$ and $22_2$ is kept. As the potential on the side of the vertical signal lines $44_1$ and $44_2$ is higher than that in the first period by 0.001 V, the potential of V11 (V12) increases to 1.501 V. If the gains of the differential amplifiers $20_1$ and $20_2$ are high enough at this point, the circuits formed with the coupling capacitors $22_1$ and $22_2$, the differential amplifiers $20_1$ and $20_2$, and the feedback capacitors $24_1$ and $24_2$ become integration circuits. Where Cc represents the capacity value of each of the coupling capacitors $22_1$ and $22_2$, and Cfb represents the capacity value of each of the feedback capacitors $24_1$ and $24_2$, the following relationship is established: Vo11=Cc/Cfb×Vsig. Where Cc is 5 pF, and Cfg=0.5 pF, for example, the relationship is expressed as Vo11=10× 0.001=0.01 (V). As a result, the infrared signal Vsig is amplified tenfold.

As described above, this embodiment can provide an uncooled infrared imaging device that is capable of reducing the influence of the difference in self-heating temperature between the infrared detection pixels and the reference pixels.

Although series-connected diodes are used as the thermoelectric conversion elements of the infrared detection pixels and the reference pixels in the above described embodiment, the same effects as above can be achieved by using series-connected resistors.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. An imaging device comprising:
    a semiconductor substrate;
    a reference pixel with a first concave portion disposed in a first portion of a surface of the semiconductor substrate; and
    one or more infrared detection pixels each configured to detect light with a second concave portion disposed in a second portion of the surface of the semiconductor substrate,
    the reference pixel being directly connected to the semiconductor substrate at a position where the first concave portion is not present, and including a first thermoelectric conversion unit configured to convert heat to an electric signal, the first thermoelectric conversion unit being disposed in the first concave portion and including a first thermoelectric conversion element, each infrared detection pixel including a second thermoelectric conversion unit being disposed in the second concave portion and including a second thermoelectric conversion element.

2. The imaging device according to claim 1, wherein a volume of the first thermoelectric conversion unit is less than a volume of the second thermoelectric conversion unit.

3. The imaging device according to claim 1, the one or more infrared detection pixels are two or more of the infrared detection pixels each having a first supporting structure and a second supporting structure that support the second thermoelectric conversion unit to be above the second concave portion, the one or more reference pixels are arranged in a first direction and the infrared detection pixels are arranged in the first direction and in a second direction crossing the first direction, wherein
the imaging device further comprises:
a plurality of first select lines that select one of the reference pixels and the infrared detection pixels arranged in the first direction;
a plurality of second select lines that select one of the reference pixel and the infrared detection pixels arranged in the second direction; and
a plurality of signal lines corresponding to the reference pixel and the infrared detection pixels arranged in the second direction,
the first thermoelectric conversion unit includes a first terminal and a second terminal, the first terminal being connected to corresponding one of the first select lines via a first wiring line, the second terminal being connected to corresponding one of the signal lines via a second wiring line, the first wiring line and the second wiring line not being disposed in a region where the first concave portion is present, and
the second thermoelectric conversion unit includes a third terminal and a fourth terminal, the third terminal being connected to corresponding one of the first select lines via a third wiring line disposed in the first supporting structure, the fourth terminal being connected to corresponding one of the signal lines via a fourth wiring line disposed in the second supporting structure.

4. The imaging device according to claim 3, further comprising a plurality of differential clamp circuits corresponding to the respective signal lines,
each of the differential clamp circuits including:
a coupling capacitor having one terminal connected to the corresponding one of the signal lines;
a differential amplifier having a positive-side input terminal connected to the other terminal of the coupling capacitor;
a feedback capacitor located between the positive-side input terminal of the differential amplifier and an output terminal of the differential amplifier; and
a feedback switch connected in parallel to the feedback capacitor.

5. The imaging device according to claim 4, further comprising a plurality of read transistors corresponding to the respective signal lines, each of the read transistors having one of a source and a drain connected to the output terminal of the differential amplifier, each of the read transistors having the other one of the source and the drain connected to a read line, each of the read transistors having a gate receiving a select signal from a column select circuit.

6. The imaging device according to claim 1, wherein, when $G_{th\_IMG}$ represents a heat conductance of each of the infrared detection pixels, $C_{th\_IMG}$ represents a heat capacity of each of the second thermoelectric conversion units, $G_{th\_TB}$ represents a heat conductance of the reference pixel, $C_{th\_TB}$ represents a heat capacity of the first thermoelectric conversion unit, and tsel represents a duration of flowing of current to the infrared detection pixels and the reference pixel, the following equation is established, $$\frac{1}{G_{th\_IMG}}\left\{1 - \exp\left(-\frac{tsel}{C_{th\_IMG}/G_{th\_IMG}}\right)\right\} = $$
$$\frac{1}{G_{th\_TB}}\left\{1 - \exp\left(-\frac{tsel}{C_{th\_TB}/G_{th\_TB}}\right)\right\}$$

where one of the left-hand value and the right-hand value of the equation is 0.9 to 1.1 times larger than the other one of the left-hand value and the right-hand value.

7. The imaging device according to claim 1, further comprising a differential amplifier configured to amplify a difference between signal voltages obtained from the one of more infrared detection pixels and the reference pixel.

8. The imaging device according to claim 1, wherein the first and second thermoelectric conversion elements are series-connected diodes.

9. The imaging device according to claim 1, wherein the first and second thermoelectric conversion elements are series-connected resistors.

* * * * *